(12) United States Patent
McLeod

(10) Patent No.: US 6,444,100 B1
(45) Date of Patent: Sep. 3, 2002

(54) HOLLOW CATHODE SPUTTER SOURCE

(75) Inventor: Paul Stephen McLeod, Berkeley, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 09/771,890

(22) Filed: Jan. 30, 2001

Related U.S. Application Data

(60) Provisional application No. 60/181,914, filed on Feb. 11, 2000.

(51) Int. Cl.[7] .............................................. C23C 14/35
(52) U.S. Cl. ........................... 204/192.16; 204/192.12; 204/192.15; 204/298.12; 204/298.13; 204/298.19
(58) Field of Search ..................... 204/192.12, 192.15, 204/192.16, 298.12, 298.13, 298.19

(56) References Cited

U.S. PATENT DOCUMENTS

| | | | |
|---|---|---|---|
| 3,878,085 A | 4/1975 | Corbani ...................... 204/298 |
| 4,377,773 A | 3/1983 | Hershcovitch et al. .. 315/111.81 |
| 4,407,712 A | 10/1983 | Henshaw et al. ........... 204/298 |
| 4,428,816 A | 1/1984 | Class et al. .................. 204/298 |
| 4,521,286 A | 6/1985 | Horwitz .................. 204/192 E |
| 4,588,490 A | 5/1986 | Cuomo et al. ............... 204/298 |
| 4,622,121 A | 11/1986 | Wegmann et al. .......... 204/298 |
| 4,637,853 A | 1/1987 | Bumble et al. ............. 156/345 |
| 4,863,581 A | 9/1989 | Inokuti et al. ............... 204/298 |
| 4,915,805 A | 4/1990 | Rust ....................... 204/192.12 |
| 4,933,057 A | 6/1990 | Sebastiano et al. .... 204/192.12 |
| 4,966,677 A | 10/1990 | Aichert et al. ......... 204/298.21 |
| 5,069,770 A | 12/1991 | Glocker ................. 204/192.12 |
| 5,133,850 A | 7/1992 | Kukla et al. ........... 204/298.12 |
| 5,228,963 A | 7/1993 | Rose ..................... 204/192.12 |
| 5,277,779 A | 1/1994 | Henshaw ............... 204/298.21 |
| 5,482,611 A | 1/1996 | Helmer et al. .......... 204/298.17 |
| 5,490,910 A | 2/1996 | Nelson et al. ......... 204/192.15 |
| 5,626,727 A | 5/1997 | Yamanishi et al. .... 204/192.12 |
| 5,728,280 A | 3/1998 | Scherer .................. 204/298.18 |
| 6,156,172 A | * 12/2000 | Kadokura ............. 204/298.26 |
| 6,238,857 B1 | * 12/2001 | Anzaki et al. ......... 204/192.12 |

* cited by examiner

*Primary Examiner*—Steven H. VerSteeg
(74) *Attorney, Agent, or Firm*—McDermott, Will & Emery

(57) ABSTRACT

A magnetically enhanced hollow cathode sputter source for providing a sputtered particle flux containing an increased proportion of ionized target material comprises a four-sided, box-shaped chamber open at the top and defining an interior space. Each of the interiorly facing surfaces of the chamber comprises the target material and a magnet means extends continuously around the exterior surface of the four vertical sides of the chamber for providing a sputtering plasma generated within the interior space with a racetrack-shaped electron Hall drift current. An electrically biasable substrate is positioned opposite the open top for receiving sputtered particle flux for deposition thereon.

20 Claims, 1 Drawing Sheet

HOLLOW CATHODE SPUTTER SOURCE

CROSS-REFERENCE TO PROVISIONAL APPLICATION

This application claims priority from U.S. provisional patent application Ser. No. 60/181,914 filed Feb. 11, 2000, the entire disclosure of which is incorporated herein by reference.

FIELD OF THE INVENTION

The present invention relates to an apparatus and method for performing high-rate cathode sputtering utilizing a hollow cathode sputter source for depositing high purity thin film layers of desired physical, chemical, and/or mechanical properties. The invention has particular utility in the manufacture of magnetic or magneto-optical ("MO") recording media comprising a layer stack or laminate of a plurality of layers on a suitable substrate, e.g., a disk-shaped substrate, wherein the layer stack or laminate includes an upper, carbon-based protective layer.

BACKGROUND OF THE INVENTION

Magnetic and MO media are widely employed in various applications, particularly in the computer industry for data/information storage and retrieval purposes. A magnetic medium in e.g., disk form, such as utilized in computer-related applications, comprises a non-magnetic substrate, e.g., of glass, ceramic, glass-ceramic composite, polymer, metal, or metal alloy, typically an aluminum (Al)-based alloy such as aluminum-magnesium (Al—Mg), having at least one major surface on which a layer stack comprising a plurality of thin film layers constituting the medium are sequentially deposited. Such layers may include, in sequence from the workpiece (substrate) deposition surface, a plating layer, e.g., of amorphous nickel-phosphorus (Ni—P), a polycrystalline underlayer, typically of chromium (Cr) or a Cr-based alloy such as chromium-vanadium (Cr—V), a magnetic layer, e.g., of a cobalt (Co)-based alloy, and a protective overcoat layer, typically of a carbon-based material having good mechanical (i.e., tribological) properties. A similar situation exists with MO media, wherein a layer stack is formed which comprises a reflective layer, typically of a metal or metal alloy, one or more rare-earth thermo-magnetic (RE-TM) alloy layers, one or more dielectric layers, and a protective overcoat layer, for functioning as reflective, transparent, writing, writing assist, and read-out layers, etc.

According to conventional manufacturing methodology, a majority of the above-described layers constituting magnetic and/or MO recording media are deposited by cathode sputtering, typically by means of multi-cathode and/or multi-chamber sputtering apparatus wherein a separate cathode comprising a selected target material is provided for deposition of each component layer of the stack and the sputtering conditions are optimized for the particular component layer to be deposited. Each cathode comprising a selected target material can be positioned within a separate, independent process chamber, in a respective process chamber located within a larger chamber, or in one of a plurality of separate, interconnected process chambers each dedicated for deposition of a particular layer. According to such conventional manufacturing technology, media substrates, typically in disk form, are serially transported, in linear or circular fashion, depending upon the physical configuration of the particular apparatus utilized, from one sputtering target and/or process chamber to another for sputter deposition of a selected layer thereon. In some instances, again depending upon the particular apparatus utilized, sputter deposition of the selected layer commences only when the substrate (e.g., disk) deposition surface is positioned in complete opposition to the sputtering target, e.g., after the disk has fully entered the respective process chamber or area in its transit from a preceding process chamber or area, and is at rest. Stated somewhat differently, sputter deposition commences and continues for a predetermined interval only when the substrate is not in motion, i.e., deposition occurs onto static substrates. In other instances, however, substrate transport, hence motion, between adjoining process chambers or areas is continuous, and sputter deposition of each selected target material occurs in a "pass-by" mode onto moving substrates as the latter pass by each cathode/target assembly.

Regardless of which type of sputtering apparatus is employed for forming the thin layer stacks constituting the magnetic recording medium, it is essential for obtaining high recording density, high quality media that each of the component layers be deposited in a highly pure form and with desired physical, chemical, and/or mechanical properties. Film purity depends, inter alia, upon the purity of the atmosphere in which the film is grown; hence films are grown in as low a vacuum as is practicable. However, in order to maintain the rate of sputtering of the various target materials at levels consistent with the throughput requirements of cost-effective, large-scale media manufacture, the amount of sputtering gas in the process chamber(s), typically argon (Ar), must be maintained at levels which generate and sustain plasmas containing an adequate amount of ions for providing sufficient bombardment and sputtering of the respective target material. The requirement for maintaining an adequate amount of Ar sputtering gas for sustaining the plasma at an industrially viable level, however, is antithetical to the common practice of applying a negative voltage bias to the substrates during sputter deposition thereon for achieving optimum film properties, such as, for example, the formation of carbon-based protective films containing a greater proportion of desirable $sp^3$ bonds (as in diamond), for use as protective overcoat layers in the manufacture of disk media. Contamination of the bias-sputtered films with Ar atoms occurs because the plasmas almost always contain a large number of $Ar^+$ ions, relative to the number of ions of the sputtered target species, which $Ar^+$ ions are accelerated towards the negatively biased substrate surfaces and implanted in the growing films along with the sputtered target species.

Accordingly, there exists a need for improved means and methodology for depositing, by sputtering techniques and at deposition rates consistent with the throughput requirements of automated manufacturing processing, thin films of high purity and of desired physical, chemical, and/or mechanical properties, which means and methodology overcomes the drawback associated with the apparent competing factors of the presence of a large number of ions of the sputtering gas (e.g., Ar) in the plasma and the usual application of a negative polarity substrate bias during film deposition, as described supra. More specifically, there exists a need for improved means and methodology for sputtering high purity, high quality, thin film layer stacks or laminates having optimal physical, chemical, and/or mechanical properties for use in the manufacture of single- and/or dual-sided magnetic and/or MO media, e.g., in the form of disks, which means and methodology provide rapid simple, and cost-effective formation of such media, as well as various other products and manufactures comprising at least one thin film layer.

The present invention addresses and solves compositional, throughput, and film property problems attendant upon the deposition of thin film layers by sputtering of target materials in plasmas comprising a sputter gas, which thin film deposition is utilized, inter alia, in the manufacture of high quality, thin film magnetic and/or MO recording media, while maintaining full compatibility with all aspects of conventional automated manufacturing technology therefor. Further, the means and methodology afforded by the present invention enjoy diverse utility in the manufacture of various devices and articles requiring high purity, high quality thin films with optimal physical, chemical, and/or mechanical properties.

DISCLOSURE OF THE INVENTION

An advantage of the present invention is an improved hollow cathode sputter source.

Another advantage of the present invention is an improved apparatus for sputter coating of a workpiece surface, comprising a hollow cathode sputter source.

Yet another advantage of the present invention is an improved method of coating over a workpiece, utilizing a hollow cathode sputter source.

Still another advantage of the present invention is an improved method of forming a carbon-containing protective coating on a substrate.

Additional advantages and other features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to an aspect of the present invention, the foregoing and other advantages are obtained in part by a hollow cathode sputter source providing a sputtered particle flux having an increased ionization probability, comprising:

(a) a box-shaped chamber defining an interior space, the chamber being open at the top and comprising a flat, horizontal bottom wall and a first pair of opposing, flat, vertical sidewalls connected at the lateral ends thereof by a second pair of opposing, flat, vertical sidewalls, the bottom wall and each of the sidewalls comprising an electrically conductive material, and at least the interiorly facing surfaces of the bottom wall and each of the sidewalls adapted to comprise a sputtering target material; and (b) a magnet means having a pair of vertically spaced-apart magnetic poles of opposite polarity, the magnet means continuously extending around the periphery of the box-shaped chamber along the exterior surface of each of the sidewalls for generating magnetic field lines which emerge from and re-enter each of the interiorly facing surfaces of the sidewalls at vertically spaced-apart locations, the magnet means adapted to generate an electron Hall drift current traveling in opposite directions along the interiorly facing surfaces of the first and second pairs of opposing sidewalls in a plasma discharge generated within the interior space during operation of the sputter source.

According to embodiments of the present invention, the first and second pairs of sidewalls are of equal lengths and the chamber is square-shaped or the first and second pairs of sidewalls are of unequal lengths and the chamber is rectangularly-shaped; and all of said sidewalls are electrically interconnected.

In particular embodiments according to the present invention, the bottom wall is electrically connected to the sidewalls, and the source further comprises:

(c) means for applying an electrical potential to the bottom wall and the sidewalls.

According to other embodiments of the present invention, the bottom wall is electrically isolated from the sidewalls, and the source further comprises:

(d) means for applying the same or different electrical potentials to the bottom wall and the sidewalls.

In accordance with embodiments of the present invention, the magnet means (b) comprises an electromagnet coil or a permanent magnet, and according to particular embodiments of the present invention, the permanent magnet comprises an assembly of a plurality of permanent magnets.

According to particular embodiments of the present invention, the electrically conductive material of the bottom wall and each of the sidewalls is the sputtering target material and is a metal or a carbon material, e.g., graphite.

In accordance with another aspect of the present invention, an improved apparatus for sputter coating a workpiece comprises the hollow cathode sputter source of the present invention and a workpiece mounting means for positioning a workpiece in spaced opposition to the open top of the box-shaped chamber for receiving sputtered target material from the hollow cathode sputter source.

According to particular embodiments of the present invention, the sputter coating apparatus further includes means for applying an electrical bias potential to the workpiece mounting means.

Yet another aspect of the present invention is an improved method of sputter coating a workpiece, comprising the steps of:

(a) providing a hollow cathode sputter source for generating a sputtered particle flux having an increased ionization probability, comprising:

(i) a box-shaped chamber defining an interior space, the chamber being open at the top and comprising a flat, horizontal bottom wall and a first pair of opposing, flat, vertical sidewalls connected at the lateral ends thereof by a second pair of opposing, flat, vertical sidewalls, the bottom wall and each of the sidewalls comprising an electrically conductive material, and at least the interiorly facing surfaces of the bottom wall and each of the sidewalls comprising a sputtering target material; and (ii) a magnet means having a pair of vertically spaced-apart magnetic poles of opposite polarity, the magnet means continuously extending around the periphery of the box-shaped chamber along the exterior surface of each of the sidewalls for generating magnetic field lines which emerge from and re-enter each of the interiorly facing surfaces of the sidewalls at vertically spaced-apart locations;

(b) positioning a workpiece having a deposition surface in spaced opposition to the open top of the box-shaped chamber for receiving sputtered target material from the hollow cathode sputter source;

(c) supplying a sputter gas to the interior space of the box-shaped chamber;

(d) applying an electrical potential to the hollow cathode sputter source to generate a plasma discharge therein for sputtering the target material from said interiorly facing surfaces of the bottom wall and each of the sidewalls, the plasma discharge being characterized by an electron Hall drift current traveling in opposite directions along the interiorly facing surfaces of the first and second pairs of opposing sidewalls; and (e) forming a layer of sputtered target material over the surface of the workpiece.

According to embodiments of the present invention, step (a)(i) comprises providing a box-shaped chamber wherein all of the sidewalls are electrically interconnected, and step (d) comprises applying the electrical potential to the sidewalls.

In accordance with particular embodiments of the present invention, step (a)(i) further comprises providing a box-shaped chamber wherein the bottom wall is electrically connected to the sidewalls, and step (d) comprises applying the electrical potential to the sidewalls and the bottom wall; whereas, according to other embodiments of the present invention, step (a)(i) further comprises providing a box-shaped chamber wherein the bottom wall is electrically isolated from the sidewalls, and step (d) comprises applying the same or different electrical potentials to the bottom wall and the sidewalls.

According to further embodiments of the present invention, the electrically conductive material of the bottom wall and each of said sidewalls is the sputtering target material, e.g., a metal material or a carbon material, such as graphite.

In accordance with embodiments of the present invention, step (b) further comprises applying an electrical bias potential to the workpiece for accelerating ions of the sputtered target material towards the workpiece surface for deposition thereon; the sputtering target material is a metal material or a carbon material; and the workpiece is a disk-shaped substrate for a magnetic or magneto-optical (MO) recording medium and step (e) comprises forming a carbon-containing protective layer over the surface of the medium.

Still another aspect of the present invention is a sputter source, comprising:

a box-shaped hollow cathode sputtering target defining an interior space and comprising a bottom and first and second pairs of electrically interconnected, opposing vertical sidewalls; and means for generating an electron Hall drift current traveling in opposite directions along interiorly facing surfaces of the first and second pairs of opposing sidewalls.

Additional advantages and aspects of the present invention will become readily apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not as limitative.

BRIEF DESCRIPTION OF THE DRAWINGS

The following detailed description of the embodiments of the present invention can best be understood when read in conjunction with the following drawings, in which the various features are not necessarily drawn to scale but rather are drawn as to best illustrate the pertinent features, and in which like reference numerals are employed throughout to designate similar features, wherein.

DESCRIPTION OF THE INVENTION

Figure 1:
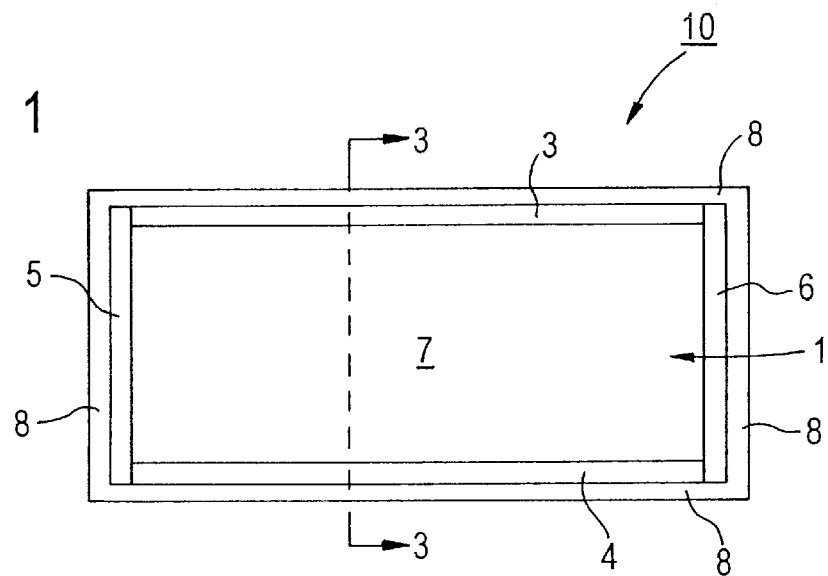
FIG. 1 is a schematic, plan view of an embodiment of a hollow cathode sputter source according to the present invention.

The present invention is based upon recognition that the above-described limitations/drawbacks of conventional sputter deposition processing, e.g., as utilized in the manufacture of disk-shaped magnetic and MO recording media, arising from the competing factors of: (1) the presence in the sputtering plasma of a large number of inert sputter gas ions (typically $Ar^+$ ions) relative to the number of ions of sputtered target material, and (2) the application to the substrate (workpiece) of an electrical bias potential, typically of negative polarity, leading to disadvantageous incorporation of the sputtering gas in the deposited film, can be avoided, or at least mitigated, by the use of a hollow cathode sputter source which provides an increased amount ionization of the sputtered target material. As a consequence of the increased generation of ions of sputtered target material, deposition of the sputtered target material on suitable substrates at industrially useful rates can occur at lower pressures than are possible with conventional planar magnetron ("PM") sputter sources. The lower pressure utilized for sputtering, in turn, results in fewer energy-reducing collisions of the sputtered particles traveling towards the substrate (i.e., longer mean free paths of the sputtered particles), thus increased arrival energies at the substrate surface, which increased arrival energies can result in advantageous atomic rearrangement and hybrid orbital formation of the depositing species, e.g., an increase in the ratio of diamond-type, hardness-promoting $sp^3$ hybridization to graphite-type $sp^2$ hybridization of sputtered diamond-like carbon ("DLC") films utilized as protective overcoat layers in the manufacture of magnetic and MO recording media.

More specifically, sputtered films utilized in the manufacture of disk-shaped magnetic and MO recording media exhibit optimal properties when the substrates (i.e., disks) are negatively biased during deposition in order to increase the arrival energy of the sputter gas flux. According to prevailing thought, it is considered that bombardment of the depositing film with ions of the sputter gas, typically $Ar^+$ ions, increases the surface mobility of the depositing particles (atoms, molecules, etc.) to facilitate their ultimate positioning in the most stable (i.e., lowest energy) lattice sites. In the case of carbon-based films utilized as protective overcoat layers for the media surfaces, the additional energy provided to the impinging sputter flux can assist in the advantageous formation of carbon-based films having a greater proportion of $sp^3$ orbital hybridization leading to diamond-like hardness characteristics. However, conventional planar magnetron type high-rate sputter deposition sources provide sputtered particle fluxes containing only a small percentage of ionized sputtered target material, and, as a consequence, few sputtered target material ions are available for high surface mobility action, orbital hybridization, and/or large bond energy formation.

According to the present invention, however, the conventional planar magnetron (PM) sputter source is replaced with a magnetically-enhanced, high-rate, hollow cathode sputter source providing a substantial amount of ionized sputtered target material in the plasma. The linear shape of the hollow cathode sputter source according to the invention facilitates formation of a linear source of atoms, molecules, particles, and ions of target material for deposition of uniform films thereof on a substrate or array of substrates (e.g., an array of disk-shaped substrates) as they pass by the source, as in a continuous, or "pass-by" type sputtering apparatus utilized in the large-scale manufacture of magnetic and/or MO recording media. The hollow cathode sputter source of the present invention is in the form of a four-sided, generally square- or rectangularly-shaped box forming a chamber open at the top and defining an interior space. At least the interiorly facing surfaces of each of the two pairs of opposing sidewalls and the bottom wall of the box-shaped chamber are formed of the target material, and a magnet (i.e., an electromagnet or permanent magnet) or magnet assembly (comprising a plurality of permanent magnets) extends continuously around the exterior surfaces of the four sidewalls for allowing the cathode to operate at lower sputter gas pressures than are possible with conventional hollow cathode sputter sources. The magnet or magnet array comprises a pair of magnetic poles of opposite polarity which are vertically spaced apart for providing magnetic field lines which emerge from and re-enter the interiorly facing surfaces of the four sidewalls at correspondingly vertically spaced-apart locations. During operation of the hollow cathode sputter source, i.e., when a plasma is generated within the interior space of the box-like chamber, the arching magnetic field lines of the continuous magnet or magnet array present over the interior surfaces of each of the four sidewalls cooperate to form a circularly- or oval-shaped "racetrack" path (depending upon whether the box-shaped chamber is square or rectangular) for the electron Hall drift current which is established as a result of the combination of the electric and magnetic fields. As a consequence of the formation of a closed path within the interior space of the chamber, the electron Hall drift currents are in opposite direction on opposing interiorly facing surfaces, and a very efficient electron trap is formed. In turn, the probability of ionization of any atom or other particle of either the inert sputter gas or the target material is greatly increased in the region of the electron trap, and the proportion of ionized sputtered target atoms/particles is increased relative to that obtainable with a conventional PM target.

According to the invention, the bottom (i.e., horizontal) wall of the box-shaped chamber ("backplane") is fabricated of the same material as that of the (vertical) sidewalls so that contamination of the sputtered deposits is avoided. In addition, the backplane can, if desired, be electrically isolated from the electrically interconnected sidewalls for operation at different electrical potentials for controlling the discharge flux and/or erosion regions on the sidewalls. The hollow cathode source of the invention acting as a linear sputtered flux source can advantageously be mounted in conventional production sputtering apparatus in the same orientation as conventional linear PM sputtering sources.

A significant advantage afforded by the linearly-configured hollow cathode sputter source of the present invention vis-à-vis conventional linear PM sputter sources in the formation of industrially useful thin films and coatings arises from the ability to sputter deposit the various metal, metal alloy, insulative, transparent, and carbon-based thin films comprising magnetic and/or MO recording media at significantly lower operational pressures. The use of lower pressures during sputter deposition according to the invention not only yields films of higher purity than are obtainable at higher pressures, but results in a significant increase in the mean free path of the sputtered particles of target material, due to the fewer energy-reducing collisions experienced by the latter in their transit towards the substrate surface. As a consequence, the arrival energies of the sputtered particles at the deposition surface are increased, leading to greater atomic rearrangement thereat facilitating stable lattice formation, and, in the case of carbon-based protective coatings, an enhanced $sp^3/sp^2$ ratio providing the coating with a greater degree of diamond-like character.

An additional advantage provided by use of the hollow cathode sputter source of the present invention is a decrease in the amount of $Ar^+$ ions implanted in the films deposited with negative voltage substrate bias, due to an increase in the ratio of ionized sputtered particles to inert sputter gas ions ($SP^+/Ar^+$).

Figure 2:
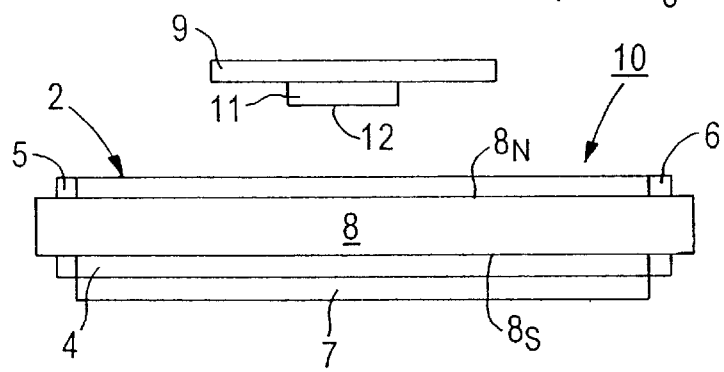
FIG. 2 is a schematic, side view of the embodiment of FIG. 1.

Referring now to FIGS. 1–2, shown therein, in schematic plan and side views, respectively, is an embodiment of a magnetically enhanced hollow cathode sputter source 10 according to the present invention, comprising a four-sided, i.e., rectangular, box-shaped chamber 1 open at the top 2 and defining an interior space, the chamber 1 being comprised of a first pair of opposing, elongated, longitudinally extending, vertical sidewalls 3, 4 comprised of an electrically conductive material, a second pair of opposing, shorter, transversely extending, vertical sidewalls 5, 6 comprised of an electrically conductive material and connected to the ends of the first pair of vertical sidewalls 3, 4, and a horizontally extending bottom wall 7 ("backplane") comprised of an electrically conductive material. A magnet means 8 comprising vertically spaced-apart, opposite polarity magnetic poles $8_N$ and $8_S$ extends continuously around the outwardly facing surfaces of each of the vertical sidewalls 3–6, which magnet means may comprise an electromagnet or a permanent magnet. In the latter instance, a plurality of strip-shaped magnets may be placed in an array with their magnetic poles aligned in a common direction to effectively form a continuous magnet means.

At least the inwardly facing surface of each of the vertical sidewalls 3–6 and the horizontal bottom wall or backplane 7 is comprised of the target material to be sputtered, i.e., an electrically conductive material such as a metal, metal alloy, carbon (e.g., graphite), or an insulative or semiconductive material. In this regard, the target material may be mounted as a layer on the inwardly facing surfaces of the vertical sidewalls and backplane or the sidewalls 3–6 and backplate 7 or they may each be formed entirely of the target material, e.g., graphite, as when forming DLC protective overcoats on magnetic or MO media. The vertical sidewalls are physically as well as electrically interconnected for structural (mechanical) integrity and for uniform application of a cathodic electrical potential thereto for establishing a plasma discharge within the interior space and effecting sputtering of the interior surfaces thereof. Typically, the bottom wall or backplane 7 is electrically isolated from the vertical sidewalls 3–6 so that a different electrical potential can be applied thereto in order to control the discharge flux as well as the location of the erosion regions on the inwardly facing surfaces of the vertical sidewalls 3–6.

An apparatus for sputter coating a workpiece utilizing sputter source 10 further comprises workpiece mounting means 9 for positioning a suitable workpiece in spaced opposition to the open top 2 of chamber 1, e.g., a disk-shaped substrate 11 for a magnetic or MO recording medium, having a deposition surface 12 for receipt of a sputtered particle flux emerging from source 10. The sputtering source according to the invention is useful in sputtering apparatus wherein the workpiece mounting means/workpiece 9/11 is maintained in a stationary position in opposition to the source 10 during the deposition process ("static" deposition) or in sputtering apparatus wherein deposition occurs during motion of the workpiece mounting means/workpiece 9/11 past the open top 2 of the source 10 ("pass-by" deposition).

Figure 3:
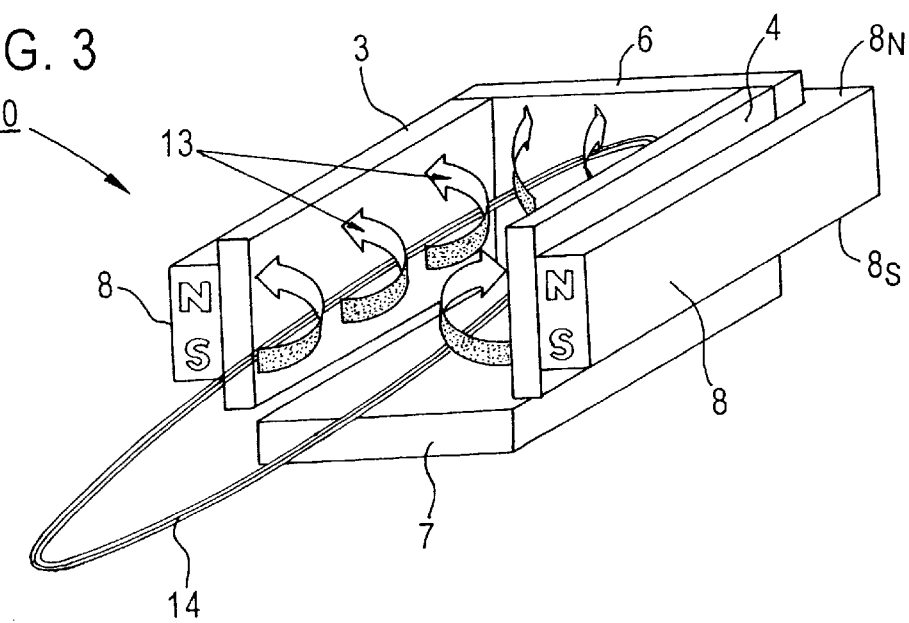
FIG. 3 is a schematic, perspective view of the embodiment of FIGS. 1–2, sectioned across line 3–3 thereof, for illustrating the principle of operation of the present invention.

Adverting to FIG. 3, shown therein is a perspective view, sectioned along line A–A' of the embodiment of FIGS. 1–2, for illustrating the principle of operation of the magnetically enhanced, high-rate, hollow cathode sputter source 10 according to the present invention, wherein magnetic field lines 13 are seen as emerging from and re-entering each of the inwardly facing surfaces of the vertical sidewalls 3–6 at vertically spaced-apart locations. The electron Hall drift current 14 is shown as oval-shaped in this embodiment (it will be more circularly-shaped in embodiments where the chamber 1 is square-shaped) and is seen to travel in opposite directions along each pair of opposing vertical sidewalls to entrap electrons for generating a high flux of ions of sputtered target material.

The present invention thus provides a number of advantages over conventional PM type sputter sources utilized in automated manufacturing processing for the deposition of high purity, high quality thin film layers and layer stacks having desired physical, electrical, and mechanical properties, such as, for example, employed in the fabrication of magnetic and MO recording media. Further, utilization of the inventive apparatus and methodology as part of conventional manufacturing apparatus can be readily implemented inasmuch as the inventive apparatus and methodology enjoys full compatibility with all other aspects of automated magnetic and MO media manufacture. Finally, the inventive apparatus and methodology are broadly applicable to sputtering processing utilized for the manufacture of a variety of different products, e.g., coated architectural glass and multilayer optical coatings.

In the previous description, numerous specific details are set forth, such as specific materials, structures, processes, etc., in order to provide a better understanding of the present invention. However, the present invention can be practiced without resorting to the details specifically set forth. In other instances, well-known processing materials and techniques have not been described in detail in order not to unnecessarily obscure the present invention.

Only the preferred embodiments of the present invention and but a few examples of its versatility are shown and described in the present invention. It is to be understood that the present invention is capable of use in various other embodiments and is susceptible of changes and/or modifications within the scope of the inventive concept as expressed herein.

What is claimed is:

1. A hollow cathode sputter source providing a sputtered particle flux having an increased ionization probability, comprising:
    (a) a box-shaped chamber defining an interior space, said chamber being open at the top and comprising a flat, horizontal bottom wall and a first pair of opposing, flat, vertical sidewalls connected at the lateral ends thereof by a second pair of opposing, flat, vertical sidewalls, said bottom wall and each of said sidewalls comprising an electrically conductive material, and at least the interiorly facing surfaces of said bottom wall and each of said sidewalls adapted to comprise a sputtering target material; and
    (b) a magnet means having a pair of vertically spaced-apart magnetic poles of opposite polarity, said magnet means continuously extending around the periphery of said box-shaped chamber along the exterior surface of each of said sidewalls for generating magnetic field lines which emerge from and re-enter each of the interiorly facing surfaces of the sidewalls at vertically spaced-apart locations, said magnet means adapted to generate an electron Hall drift current traveling in opposite directions along said interiorly facing surfaces of said first and second pairs of opposing sidewalls.

2. The sputter source according to claim 1, wherein said first and second pairs of sidewalls are of equal lengths and said chamber is square-shaped or said first and second pairs of sidewalls are of unequal lengths and said chamber is rectangularly-shaped.

3. The sputter source according to claim 1, wherein all of said sidewalls are electrically interconnected.

4. The sputter source according to claim 3, wherein said bottom wall is electrically connected to said sidewalls, further comprising:
    (c) means for applying an electrical potential to said bottom wall and said sidewalls.

5. The sputter source according to claim 3, wherein said bottom wall is electrically isolated from said sidewalls, further comprising:
    (c) means for applying the same or different electrical potentials to said bottom wall and said sidewalls.

6. The sputter source according to claim 1, wherein said magnet means (b) comprises an electromagnet coil or a permanent magnet.

7. The sputter source according to claim 6, wherein said permanent magnet comprises an assembly of a plurality of permanent magnets.

8. The sputter source according to claim 1, wherein said electrically conductive material of said bottom wall and each of said sidewalls is said sputtering target material and is a metal or a carbon material.

9. The sputter source according to claim 8, where said carbon material is graphite.

10. An apparatus for sputter coating a workpiece, comprising the sputter source of claim 1 and a workpiece mounting means for positioning a workpiece in spaced opposition to said open top of said box-shaped chamber for receiving sputtered target material from said hollow cathode sputter source.

11. The apparatus according to claim 10, further including means for applying an electrical bias potential to said workpiece mounting means.

12. A method of sputter coating a workpiece, comprising the steps of:
    (a) providing a hollow cathode sputter source for generating a sputtered particle flux having an increased ionization probability, comprising:
        (i) a box-shaped chamber defining an interior space, said chamber being open at the top and comprising a flat, horizontal bottom wall and a first pair of opposing, flat, vertical sidewalls connected at the lateral ends thereof by a second pair of opposing, flat, vertical sidewalls, said bottom wall and each of said sidewalls comprising an electrically conductive material, and at least the interiorly facing surfaces of said bottom wall and each of said sidewalls comprising a sputtering target material; and
        (ii) a magnet means having a pair of vertically spaced-apart magnetic poles of opposite polarity, said magnet means continuously extending around the periphery of said box-shaped chamber along the exterior surface of each of said sidewalls for generating magnetic field lines which emerge from and re-enter each of said interiorly facing surfaces of said sidewalls at vertically spaced-apart locations;

(b) positioning a workpiece having a deposition surface in spaced opposition to said open top of said box-shaped chamber for receiving sputtered target material from said hollow cathode sputter source;

(c) supplying a sputter gas to said interior space of said box-shaped chamber;

(d) applying an electrical potential to said hollow cathode sputter source to generate a plasma discharge therein for sputtering said target material from said interiorly facing surfaces of said bottom wall and each of said sidewalls, said plasma discharge being characterized by an electron Hall drift current traveling in opposite directions along said interiorly facing surfaces of said first and second pairs of opposing sidewalls; and (e) forming a layer of sputtered target material over said surface of said workpiece.

13. The method as in claim 12, wherein step (a)(i) comprises providing a box-shaped chamber wherein all of said sidewalls are electrically interconnected, and step (d) comprises applying said electrical potential to said sidewalls.

14. The method as in claim 13, wherein step (a)(i) further comprises providing a box-shaped chamber wherein said bottom wall is electrically connected to said sidewalls, and step (d) comprises applying said electrical potential to said sidewalls and said bottom wall.

15. The method as in claim 13, wherein step (a)(i) further comprises providing a box-shaped chamber wherein said bottom wall is electrically isolated from said sidewalls, and step (d) comprises applying the same or different electrical potentials to said bottom wall and said sidewalls.

16. The method as in claim 12, wherein said electrically conductive material of said bottom wall and each of said sidewalls is said sputtering target material.

17. The method as in claim 12, wherein:

step (b) further comprises applying an electrical bias potential to said workpiece for accelerating ions of said sputtered target material towards said workpiece surface for deposition thereon.

18. The method as in claim 17, wherein said sputtering target material is a metal material or a carbon material.

19. The method as in claim 18, wherein said workpiece is a disk-shaped substrate for a magnetic or magneto-optical (MO) recording medium and step (e) comprises forming a carbon-containing protective layer over the surface of said medium.

20. A sputter source, comprising:

a box-shaped hollow cathode sputtering target defining an interior space and comprising a bottom wall and first and second pairs of electrically interconnected, opposing vertical sidewalls; and means continuously extending around the periphery of said box-shaped target for generating a continuous loop-shaped electron Hall drift current traveling in opposite directions along interiorly facing surfaces of said first and second pairs of opposing sidewalls.

* * * * *